United States Patent [19]
Matsuoka et al.

[11] Patent Number: 4,580,133
[45] Date of Patent: Apr. 1, 1986

[54] DISPLAY DEVICE

[75] Inventors: Mikiharu Matsuoka, Tokyo; Hirohiko Katayama, Kawasaki, both of Japan

[73] Assignee: Canon Kabushiki Kaisha, Tokyo, Japan

[21] Appl. No.: 491,796

[22] Filed: May 5, 1983

[30] Foreign Application Priority Data

May 14, 1982 [JP] Japan ................................ 57-80160

[51] Int. Cl.$^4$ ............................................. G09G 1/28
[52] U.S. Cl. .................................... 340/701; 340/762; 340/782; 381/48
[58] Field of Search ............... 340/701, 703, 706, 752, 340/762, 782, 825.19, 815.11, 815.03; 434/185; 73/659; 324/77 R; 381/48

[56] References Cited

U.S. PATENT DOCUMENTS

| 3,595,991 | 7/1971 | Diller | 340/782 |
| 3,881,059 | 4/1975 | Stewart | 381/48 |
| 4,063,035 | 12/1977 | Appelman et al. | 381/48 |
| 4,276,445 | 6/1981 | Harbeson | 381/48 |
| 4,378,466 | 3/1983 | Esser | 340/706 |

FOREIGN PATENT DOCUMENTS 0064 4/1983 Japan ................................ 324/77 R

OTHER PUBLICATIONS

Electronic Engineering, Dec. 1977, vol. 49, No. 600 Solid State Oscilloscope Using 10 LED Bars.

Primary Examiner—Gerald L. Brigance
Assistant Examiner—Jeffery A. Brier
Attorney, Agent, or Firm—Fitzpatrick, Cella, Harper & Scinto

[57] ABSTRACT

A display device for providing assistance in phonation training or the like has a microphone, comparators, latch circuits, and LED's. When a teacher produces reference sounds, his voice spectrum is displayed on a screen by red LED's, for example, and is continuously displayed until commanded otherwise. Then, a student practices and his voice spectrum is displayed on the same screen by green LED's. The student can repeatedly practice by erasing his voice spectrum until the two spectra coincide with each other. A teacher's voice spectrum may be stored in a ROM or the like in advance. When a student wishes to practice, the teacher's voice spectrum may be read out from the ROM and displayed on the screen. The student can then practice in a similar manner.

4 Claims, 4 Drawing Figures

DISPLAY DEVICE

BACKGROUND OF THE INVENTION

1. Field of the Invention

The present invention relates to a display device which displays voice data and, more particularly, to a display device which displays data of two different voices on a single screen in different colors.

2. Description of the Prior Art

Phonation training of deaf and/or dumb persons has conventionally been performed such that a teacher produces speech and a student simulates the movement of the teacher's mouth. However, with this conventional method, the student cannot discriminate if he is producing sounds correctly, and this has prevented effective training. Furthermore, even if a student learns to produce sounds correctly to some extent, he will forget how to do it if he does not train for a long period of time.

SUMMARY OF THE INVENTION

It is an object of the present invention to provide a display device which is capable of displaying both reference voice data and voice data of a student on a single screen in different colors.

It is another object of the present invention to provide a display device which is capable of displaying first voice data which has been input and is also capable of displaying second voice data while allowing reference to the first voice data.

It is still another object of the present invention to provide a display device comprising input means for inputting first and second voice data; dividing means for dividing both first and second voice data input through said input means at predetermined intervals; first memory means for storing the first voice data which is divided by said dividing means; second memory means for storing the second voice data which is divided by said dividing means; and display means for displaying, on a single display screen, both the first voice data which is divided by said dividing means and is stored in said first memory means and the second voice data which is divided by said dividing means and is stored in said second memory means.

It is still another object of the present invention to provide a display device comprising input means for inputting first and second voice data; clock signal generating means for generating clock signals during a period in which the first and second voice data are input through said input means; counting means for counting the clock signals generated by said clock generating means; dividing means for dividing the first and second voice data on the basis of a count of said counting means; and display means consisting of a plurality of first display elements for displaying the first voice data which is divided by said dividing means and a plurality of second display elements for displaying the second voice data which is divided by said dividing means.

It is still another object of the present invention to provide a display device comprising input means for inputting first and second voice data; converting means for converting the first and second voice data input through said input means into a plurality of sound pressure data; means for sampling at predetermined intervals the pressure data corresponding to the first and second voice data from said converting means; and display means for displaying, on a single display screen voice data which have been sampled at the predetermined intervals by said sampling means.

DETAILED DESCRIPTION OF THE PREFERRED EMBODIMENTS

Figure 1:
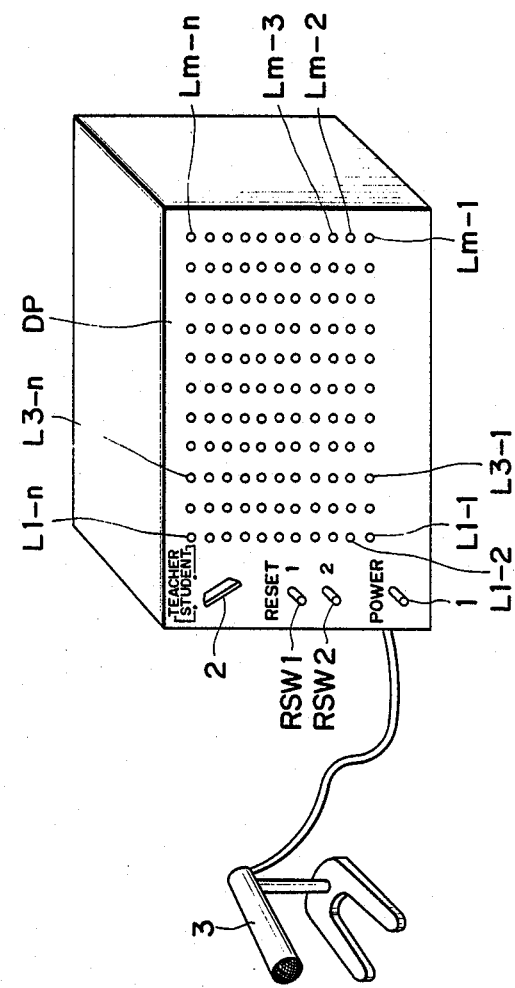
FIG. 1 is a perspective view showing the outer appearance of a display device according to the present invention.
Figure 2A:
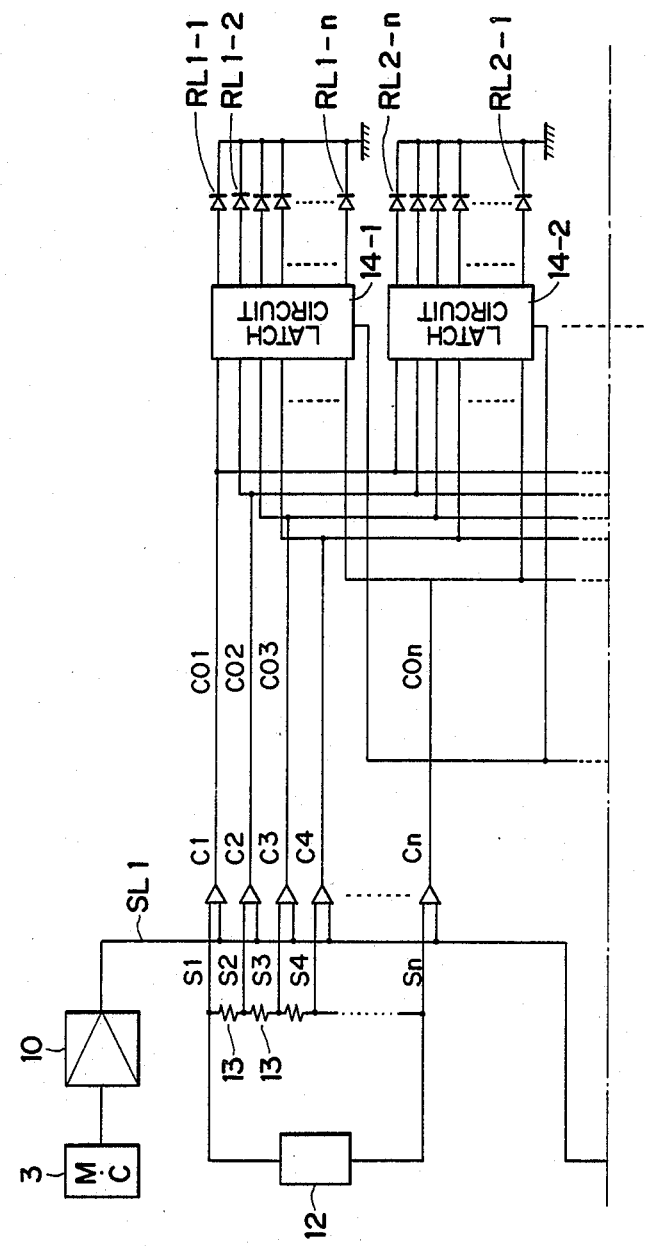
Figure 2B:
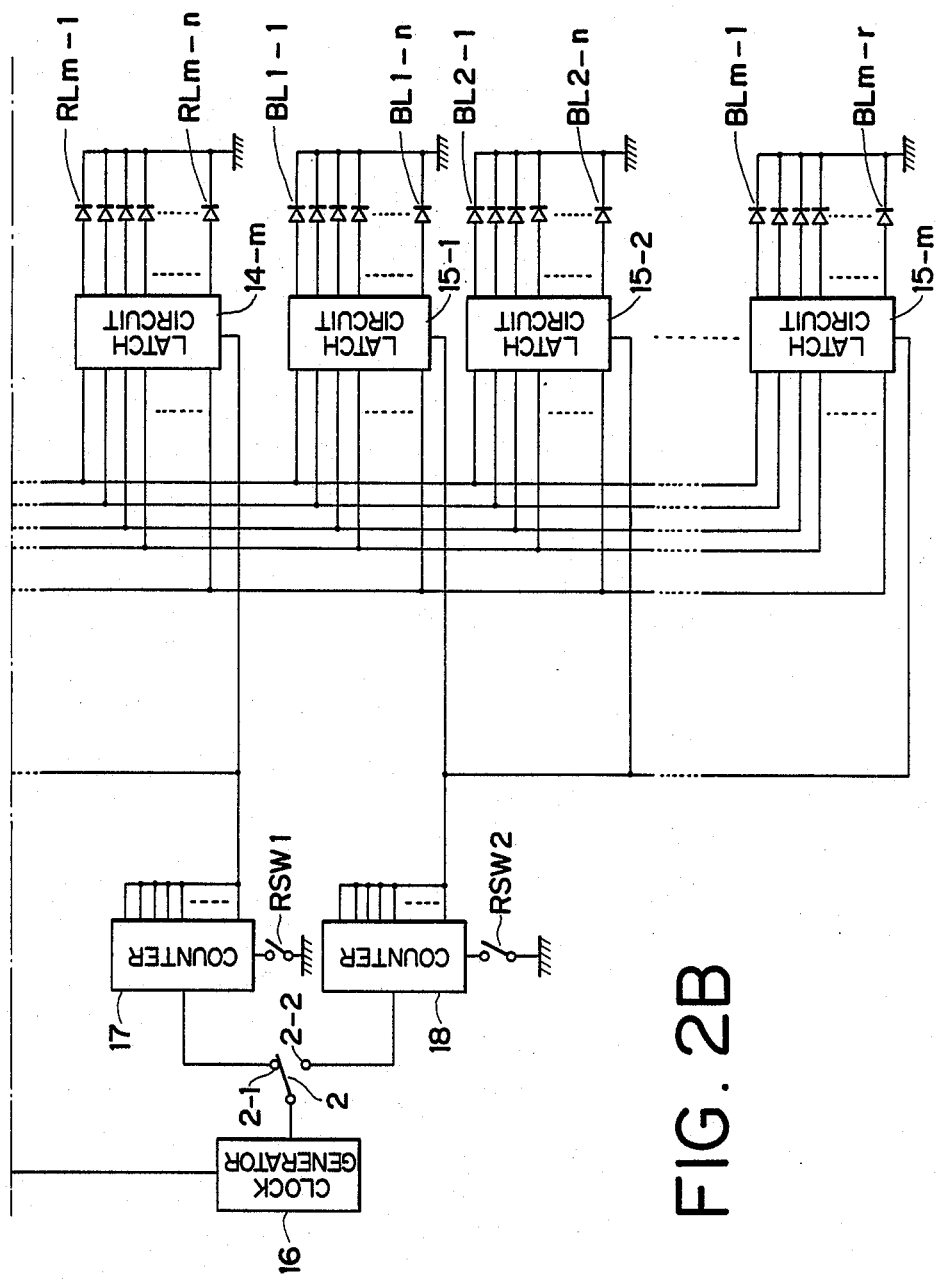

FIG. 1 is a perspective view of a phonation training apparatus using a display device of the present invention. A display section DP comprises m × n display cells L. Each display cell L comprises a red LED and a green LED which are encapsulated within a single capsule.

When a power switch 1 is turned on, the apparatus is rendered operative. A teacher/student selection switch 2 is switched to the teacher mode, and voice data is input through microphone 3. Then, the red LED's of the display cells L of the display section DP are turned on to display the voice spectrum of the teacher, which is continuously displayed at the display section DP. In the display section DP, time is plotted in the horizontal direction and sound pressure is plotted in the vertical direction. When the switch 2 is switched to the student mode and a student speaks into the microphone 3, the green LED's of the display cells L of the display section DP are turned on to display the voice spectrum of the student.

Since the voice spectrum of the teacher is continuously displayed in red at the display section DP, the student can practice while comparing red and green voice spectra until they coincide with each other.

A first reset switch RSW1 is for erasing the voice spectrum which is displayed by the red LED's of the display cells L of the display section DP, that is the voice spectrum of the teacher. A second reset swich RSW2 is for erasing the voice spectrum which is displayed by the green LED's of the display cells L of the display section DP, that is, the voice spectrum of the student.

Figure 2:
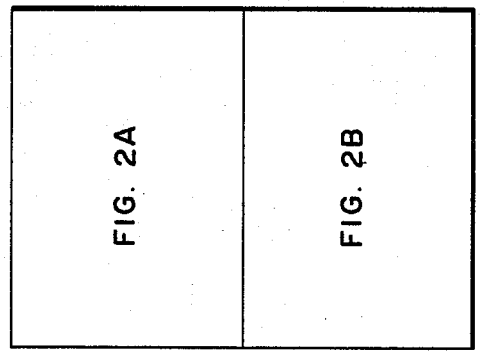
FIG. 2 composed of FIGS. 2A and 2B is a block diagram showing the configuration of the display device shown in FIG. 1.

FIG. 2 is a block diagram of the display device according to the present invention.

A DC power supply 12 produces a reference voltage, which is divided by voltage dividing resistors 13 which produce different reference voltages on signal lines S1 to Sn, respectively. Thus, a voltage E1 is supplied on the signal line S1, a voltage E2 is supplied on the signal line S2, . . . , and a voltage En is supplied on the signal line En (where $E1 < E2 < E3 < \ldots < En$).

A voice signal input through the microphone 3 is amplified by an amplifier 10 and is supplied on a signal line SL1 to comparators C1 to Cn, and also starts a clock generator 16. A clock signal from the clock generator 16 is supplied to a counter 17 through a switch 2. The count output from the counter 17 sequentially commands latch circuits 14-1, 14-2, . . . , and 14-m so as to sequentially latch the output signals from the comparators C1 to Cn therein.

When the level of the voice signal on the signal line SL1 is higher than the reference signal on the corresponding one of the signal lines S1 to Sn, each of the comparators C1 to Cn produces a signal of high level.

Otherwise, each comparator produces a signal of low level.

The signal of high level on each of signal lines CO1 to COn changes over time in accordance with the voice signal input through the microphone 3. The signals of high level on the signal lines CO1 to COn corresponding to the latch circuits 14-1 to 14-m which sequentially receive the latch commands are latched in these latch circuits so as to drive corresponding red LED's RL1 to RLm. When "a" is produced within a time period m×T, the latch circuit 14-1 is driven for an initial time period T, the latch circuit 14-2 is driven for the next time period 2T, and so on. Thus, the latch circuits are sequentially driven to drive the corresponding red LED's RL1 to RLm.

These latch circuits 14-1 to 14-m serve as memories to maintain the display state until the reset switch RSW1 is driven.

A similar set of a counter 18, latch circuits 15-1 to 15-m, and green LED's BL1 to BLm is also included.

When the switch 2 is switched to the student mode (contact 2-2) and the student produces sounds corresponding to those made by the teacher, the output signals from the comparators C1 to Cn are sequentially latched by the latch circuits 15-1 to 15-m which drive the corresponding green LED's BL1 to BLm.

The LED's RL1-1 and BL1-1 are housed in a display cell L1-1, the LED's RL1-2 and BL1-2 are housed in a display cell L1-2, the LED's RL1-n and BL1-n are housed in a display cell L1-n, . . . , and the LED's RLm-n and BLm-n are housed in a display cell Lm-n. Watching the voice spectrum of the teacher displayed in red, the student can practice producing sounds until his (green) voice spectrum finally coincides with the teacher's (red) voice spectrum. Since the reset switch RSW2 serves as a reset switch for the latch circuits 15-1 to 15-m, the student can erase only his voice spectrum displayed in green, and can practice repeatedly until the red and green voice spectra coincide with each other.

In the description of the above embodiment, each display cell has therein a red LED and a green LED. However, it is possible to obtain a similar effect with a display section DP of the following configuration. The display section DP is divided into upper and lower portions. The red LED's connected to the latch circuits 14-1 to 14-m as shown in FIG. 2 are arranged in the respective display cells of the upper portion, while the green LED's connected to the latch circuits 15-1 to 15-m are arranged in the respective display cells of the lower portion. With this display section DP, the voice spectrum of the teacher may be displayed at the upper portion of the display section DP. Then, while referring to the voice spectrum of the teacher thus displayed in red, the student produces sounds. The voice spectrum of the student is displayed at the lower portion of the display section DP. In this manner, the student can practice phonation while comparing his voice spectrum with that of the teacher.

In the above embodiment, the teacher inputs reference voice data through a microphone. However, reference voice data may be stored in a ROM and may be read out and latched in the latch circuits 14-1 to 14-m for driving the corresponding red LED's.

In such a case, the names of the readout voice data, e.g., "a" in the above-mentioned case, are stored in the forms of code signals. Then, such a code signal may be read out and is displayed on a display device (not shown). Thus, the student can confirm that the voice spectrum being displayed on the screen corresponds to "a". With this configuration, a student can practice alone without the assistance of a teacher.

In summary, according to the present invention, there is provided a display device which displays first and second voice data on a display screen in different colors, and which is suitable for phonation training or the like.

What we claim is:

1. A display device comprising:
    input means for providing first and second voice data;
    sampling means for sampling the first and second voice data provided by said input means at predetermined intervals;
    first memory means for storing the first voice data sampled by said sampling means;
    second memory means for storing the second voice data sampled by said sampling means; and
    display means for displaying, on a single display screen, both the first voice data sampled by said sampling means and stored in said first memory means and the second voice data sampled by said first sampling means and stored in said second memory means, said display means including a plurality of first display elements for displaying the first voice data sampled by said sampling means by emitting light of a first color and a plurality of second display elements for displaying the second voice data sampled by said sampling means by emitting light of a second color, each of said first display elements and a corresponding one of said second display elements being encapsulated in a cell.

2. A device according to claim 1, wherein said display elements comprise LED's.

3. A display device comprising:
    input means for providing first and second voice data;
    clock signal generating means for generating clock signals during a period in which the first and second voice data are provided by said input means;
    counting means for counting the clock signals generated by said clock generating means;
    sampling means for sampling the first and second voice data on the basis of a count of said counting means; and
    display means including a plurality of first display elements for displaying the first voice data sampled by said sampling means by emitting light of a first color and a plurality of second display elements for displaying the second voice data sampled by said sampling means by emitting light of a second color, each of said first display elements and a corresponding one of said second display elements being encapsulated in a cell.

4. A device according to claim 3, wherein said display elements comprise LED's.

* * * * *

UNITED STATES PATENT AND TRADEMARK OFFICE
CERTIFICATE OF CORRECTION

PATENT NO. : 4,580,133

DATED : April 1, 1986

INVENTOR(S) : MIKIHARU MATSUOKA, ET AL.

It is certified that error appears in the above-identified patent and that said Letters Patent is hereby corrected as shown below:

Column 2, line 41, change "that is the" to --that is, the--; and
line 42, change "swich" to --switch--.

Column 4, line 30, delete "first".

Signed and Sealed this

Eighteenth Day of November, 1986

Attest:

DONALD J. QUIGG

Attesting Officer    Commissioner of Patents and Trademarks